United States Patent
Fujita et al.

(10) Patent No.: US 9,571,766 B2
(45) Date of Patent: Feb. 14, 2017

(54) SOLID-STATE IMAGING DEVICE

(71) Applicant: HAMAMATSU PHOTONICS K.K., Hamamatsu-shi, Shizuoka (JP)

(72) Inventors: Kazuki Fujita, Hamamatsu (JP); Ryuji Kyushima, Hamamatsu (JP); Harumichi Mori, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/896,023

(22) PCT Filed: May 29, 2014

(86) PCT No.: PCT/JP2014/064333
§ 371 (c)(1),
(2) Date: Dec. 4, 2015

(87) PCT Pub. No.: WO2014/199840
PCT Pub. Date: Dec. 18, 2014

(65) Prior Publication Data
US 2016/0127668 A1    May 5, 2016

(30) Foreign Application Priority Data
Jun. 11, 2013 (JP) ................................ 2013-122909

(51) Int. Cl.
*H04N 3/14* (2006.01)
*H04N 5/335* (2011.01)
(Continued)

(52) U.S. Cl.
CPC ...... *H04N 5/3698* (2013.01); *H01L 27/14603* (2013.01); *H01L 27/14609* (2013.01);
(Continued)

(58) Field of Classification Search
CPC ........ H04N 5/335; H04N 5/369; H04N 5/374; H04N 5/3741; H04N 5/3742; H04N 3/1575
(Continued)

(56) References Cited

U.S. PATENT DOCUMENTS

| 6,407,770 | B1 | 6/2002 | Bielski et al. |
| 2002/0164861 | A1 | 11/2002 | Endoh |
| 2005/0206766 | A1* | 9/2005 | Suzuki .................. H04N 9/045 348/308 |
| 2006/0261255 | A1* | 11/2006 | Raynor ............ H01L 27/14603 250/214 R |

(Continued)

FOREIGN PATENT DOCUMENTS

| JP | 2000-046645 A | 2/2000 |
| JP | 2009-089078 A | 4/2009 |

(Continued)

*Primary Examiner* — Kelly L Jerabek
(74) *Attorney, Agent, or Firm* — Drinker Biddle & Reath LLP

(57) ABSTRACT

A solid-state imaging device includes a sensor panel section and a readout circuit section. The sensor panel section is disposed on a glass substrate and has a photodetecting section including pixels arrayed in M rows and N columns, row selection lines, and readout lines. The readout circuit section is disposed on a substrate and has N integration circuits. Rectifier circuits are connected between nodes, between N panel-side connection points and the integration circuits, and a constant potential line. Circuit elements having resistance components are connected between the nodes and readout lines.

8 Claims, 13 Drawing Sheets

(51) Int. Cl.

| | | |
|---|---|---|
| *H04N 5/369* | (2011.01) | |
| *H04N 5/32* | (2006.01) | |
| *H04N 5/367* | (2011.01) | |
| *H01L 27/146* | (2006.01) | |
| *H04N 5/374* | (2011.01) | |
| *H04N 5/378* | (2011.01) | |

(52) U.S. Cl.
CPC .. *H01L 27/14618* (2013.01); *H01L 27/14632* (2013.01); *H01L 27/14658* (2013.01); *H01L 27/14663* (2013.01); *H04N 5/32* (2013.01); *H04N 5/367* (2013.01); *H04N 5/369* (2013.01); *H04N 5/374* (2013.01); *H04N 5/378* (2013.01); *H01L 2224/48091* (2013.01); *H01L 2224/48137* (2013.01); *H01L 2224/49175* (2013.01)

(58) Field of Classification Search
USPC .......................................... 348/294, 302–310
See application file for complete search history.

(56) References Cited

U.S. PATENT DOCUMENTS

| | | | | |
|---|---|---|---|---|
| 2007/0229687 | A1* | 10/2007 | Hiyama | H04N 3/1568 348/294 |
| 2010/0193692 | A1* | 8/2010 | Mori | G01T 1/00 250/366 |
| 2013/0292549 | A1* | 11/2013 | Fujita | H01L 27/14658 250/208.1 |
| 2013/0299679 | A1* | 11/2013 | Kyushima | H01L 27/14632 250/208.1 |
| 2013/0308030 | A1* | 11/2013 | Fujita | H04N 5/3456 348/302 |
| 2014/0118587 | A1* | 5/2014 | Ikedo | H04N 5/23212 348/281 |

FOREIGN PATENT DOCUMENTS

| | | |
|---|---|---|
| JP | 2009-302092 A | 12/2009 |
| JP | 2012-151551 | 8/2012 |
| WO | WO 2008/108734 | 9/2008 |

* cited by examiner

*Fig.5*
(a)
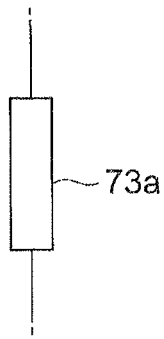
(b)
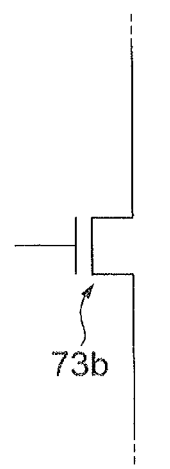

Fig.13
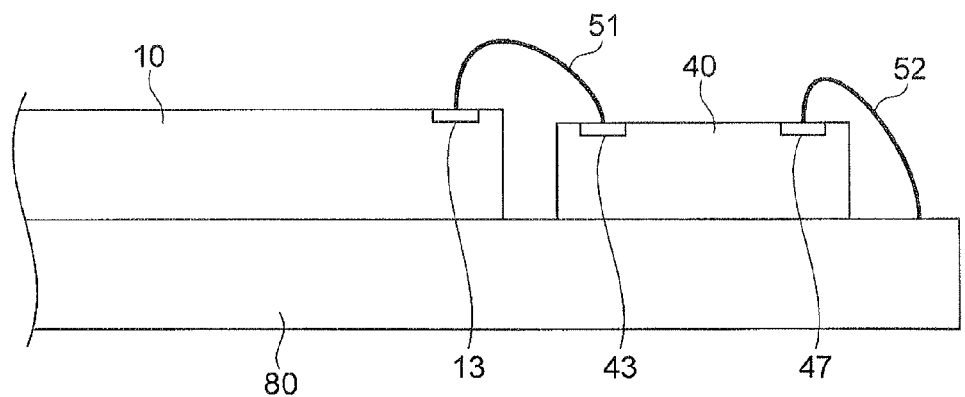
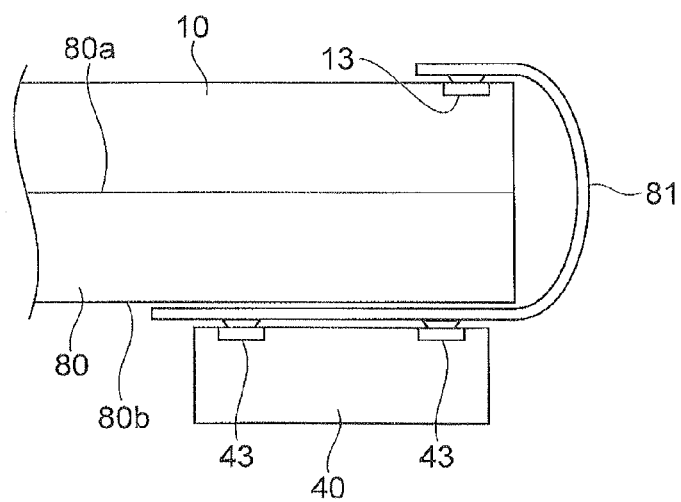

SOLID-STATE IMAGING DEVICE

TECHNICAL FIELD

The present invention relates to a solid-state imaging device.

BACKGROUND ART

Patent Literature 1 describes a technique concerning a photoelectric conversion device comprising a plurality of photoelectric conversion elements arranged in a matrix form, and a method for manufacturing the same. In this photoelectric conversion device and manufacturing method, when a part of photoelectric conversion signal output is inappropriate, a matrix signal line corresponding to the signal is cut with laser and the like in order to prevent a defect such as disconnection occurring in the matrix signal line from causing crosstalk to other signal lines.

Patent Literature 2 describes a technique concerning a solid-state imaging device. This solid-state imaging device eliminates leak currents by electrically separating a failure portion caused by a short circuit of signal lines within a pixel and the like in a CCD image sensor or a CMOS image sensor. For the separation, a separation circuit section is provided between a pixel block section and a readout circuit section.

Patent Literature 3 describes a technique concerning a solid-state imaging device. In this solid-state imaging device, a protection diode is provided between scanning lines and data lines and a constant potential line for electrostatic protection in each pixel in order to prevent electrostatic breakdown from occurring.

CITATION LIST

Patent Literature

Patent Literature 1: Japanese Patent Application Laid-Open No. 2000-046645
Patent Literature 2: Japanese Patent Application Laid-Open No. 2009-089078
Patent Literature 3: Japanese Patent Application Laid-Open No. 2009-302092

SUMMARY OF INVENTION

Technical Problem

A solid-state imaging device has a photodetecting section in which a plurality of pixels are arrayed two-dimensionally over a plurality of rows and a plurality of columns. A photodiode for converting light incident thereon into an electron is arranged in each pixel. The photodiodes of the pixels are connected through transistors to readout lines provided for the respective columns, and charges accumulated within the photodiode flow out to the readout line when the transistor is turned on. The charges reach an integration circuit through the readout line and are converted into a voltage signal in the integration circuit.

A row selection line provided for each row is connected to a control terminal of the transistor of each pixel. An on-voltage for the transistor is applied from the row selection line to the control terminal for each row, whereby the charges are read out from the pixels for each row. An imaging element in which a readout line for each column is thus provided with an integration circuit without having an amplifier circuit for each pixel is referred to as passive pixel sensor (PPS). An imaging element having an amplifier circuit for each pixel is referred to as active pixel sensor (APS).

One mode of abnormality in the solid-state imaging device having the configuration described above is a short circuit between the row selection line and readout line. When the row selection line and readout line are short-circuited to each other, the potential of the readout line approaches that of the row selection line (i.e., the potential of the control terminal of the transistor). This causes the output voltage value from the integration circuit to become an abnormal value. When the output voltage value is abnormal in only one column, the pixel value of this column can be interpolated by using pixel values of its adjacent columns. When the output abnormal value of such an integration circuit is too large, however, it may affect operations of other integration circuits adjacent thereto, whereby output voltage values from the other integration circuits may also become abnormal. If output voltage values of a plurality of columns thus become abnormal, it will be hard to interpolate the pixel values of these columns.

In view of the above problem, it is an object of the present invention to provide a solid-state imaging device which, even when a short circuit between a row selection line and a readout line occurs at a certain column, can prevent output voltage values from integration circuits at the other columns from becoming abnormal.

Solution to Problem

In order to solve the above-described problem, the solid-state imaging device in accordance with the present invention comprises a sensor panel section formed on a first substrate, and having a photodetecting section constructed by two-dimensionally arraying pixels, each including a photodiode and a thin-film transistor having one current terminal connected to the photodiode, over a plurality of rows and a plurality of columns, a plurality of row selection lines provided for the respective rows and connected to control terminals of the thin-film transistors included in the pixels of the corresponding rows, and a plurality of readout lines provided for the respective columns and connected to the other current terminals of the thin-film transistors included in the pixels of the corresponding columns; a readout circuit section disposed on a second substrate different from the first substrate, and having a plurality of integration circuits for respectively outputting voltage values corresponding to amounts of charges input through the plurality of readout lines; a plurality of panel-side connection points disposed on the first substrate, and for respectively interconnecting the plurality of readout lines on the first substrate and the plurality of integration circuits on the second substrate; a plurality of rectifier circuits respectively connected between a plurality of nodes, between the plurality of panel-side connection points and the plurality of integration circuits, and a constant potential line; and a plurality of circuit elements respectively connected between the plurality of nodes and the plurality of readout lines, and having resistance components.

In this solid-state imaging device, a sensor panel section is provided with a panel-side connection point for interconnecting a readout line and an integration circuit, and a rectifier circuit is connected between a node between the panel-side connection point and integration circuit and a constant potential line. A circuit element having a resistance component is further connected between the node and readout line.

When a row selection line and a readout line are short-circuited to each other at a certain column of this solid-state imaging device, the readout line changes its potential, whereby the rectifier circuit connected between the constant potential line and readout line is turned on. At this time, a current flowing between the row selection line and the constant potential line passes through the circuit element having a resistance component, so that the potential of the wiring line located closer to the integration circuit with respect to the circuit element, i.e., the input potential to the integration circuit, is held at the potential of the constant potential line (a potential obtained by subtracting therefrom the voltage drop caused by the rectifier circuit to be exact). This can inhibit the output abnormal value of the integration circuit at this column from increasing too much and suppress influence over operations of other integration circuits, thereby preventing output voltage values from the other integration circuits from becoming abnormal.

Advantageous Effects of Invention

The solid-state imaging device in accordance with the present invention, even when a short circuit between a row selection line and a readout line occurs at a certain column, can prevent output voltage values from integration circuits at the other columns from becoming abnormal.

BRIEF DESCRIPTION OF DRAWINGS

FIG. 5 includes (a), (b) diagrams illustrating examples of circuit elements.

FIG. 13 includes (a), (b) diagrams illustrating examples of electric connection structures between a sensor panel section and a readout circuit section as a third modified example.

DESCRIPTION OF EMBODIMENTS

An embodiment of the solid-state imaging device in accordance with the present invention will be described below in detail with reference to the accompanying drawings. In the explanation of the drawings, the same elements will be denoted by the same reference signs, while omitting their overlapping descriptions.

The solid-state imaging device in accordance with an embodiment is used for a medical X-ray imaging system, for example, in particular in a system for capturing an X-ray image of a jaw part of a subject by such imaging modes as panoramic imaging, cephalometric imaging, and CT imaging in dental care. Therefore, the solid-state imaging device of this embodiment comprises a thin-film transistor formed by depositing amorphous silicon on a glass substrate having a large area and a photodiode formed by depositing amorphous silicon, and thus has a photodetecting area much wider than that of a conventional solid-state imaging device made of a monocrystalline silicon wafer.

Figure 1:
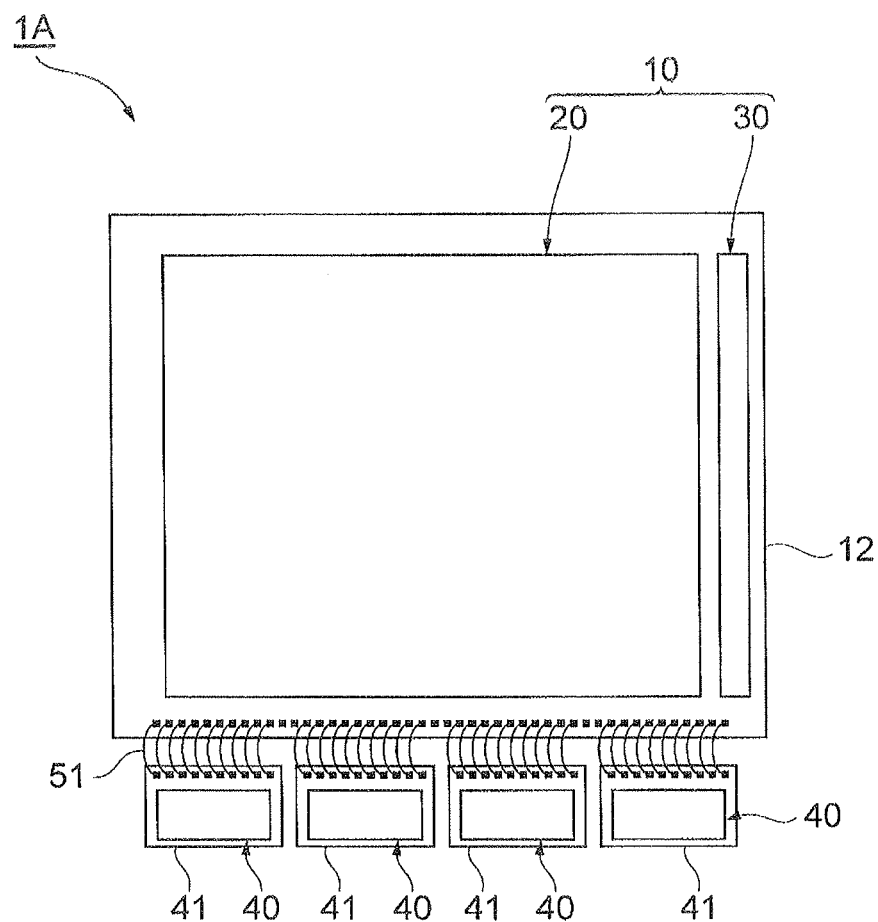
FIG. 1 is a plan view illustrating a configuration of a solid-state imaging device in accordance with one embodiment.
Figure 2:
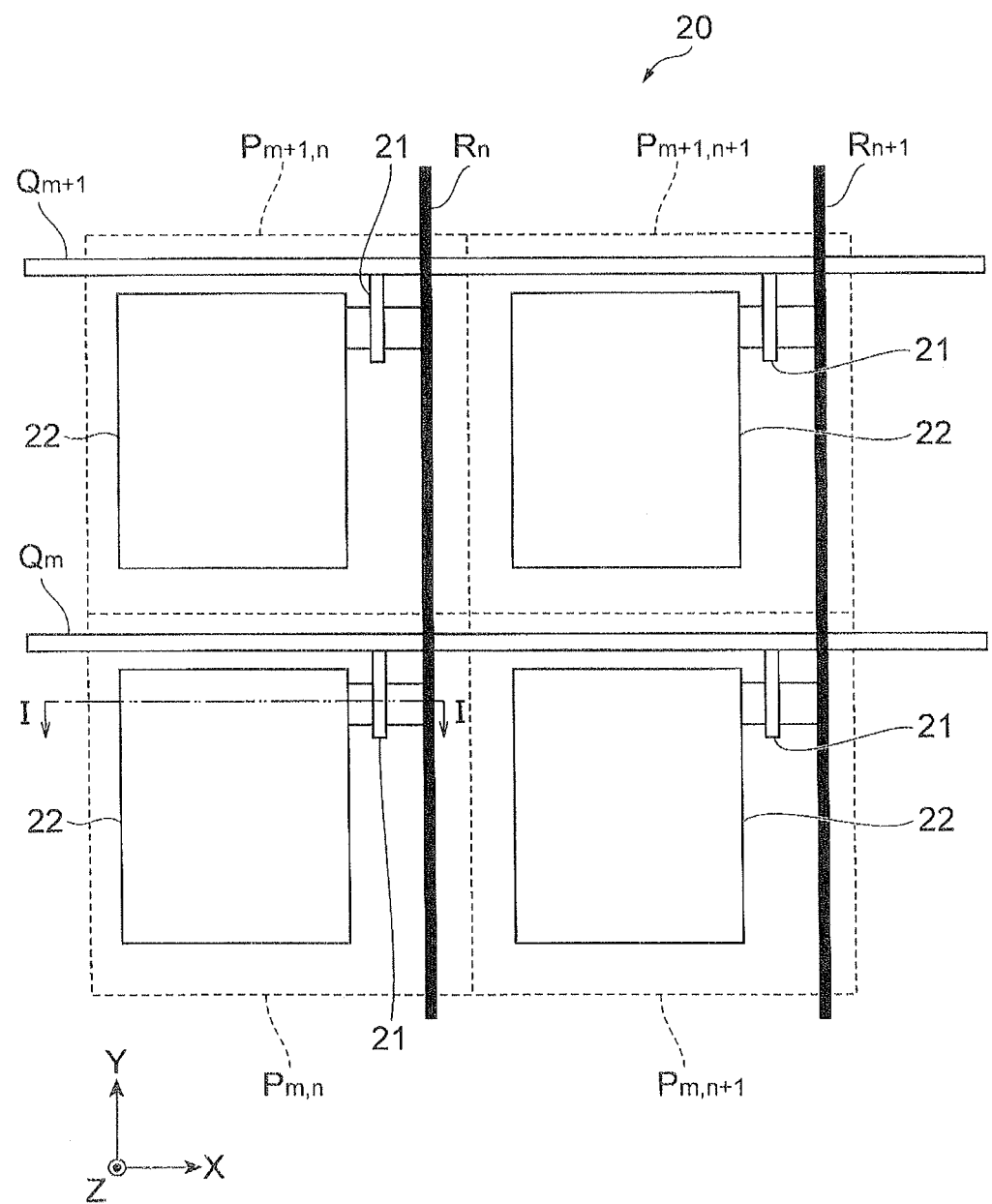
FIG. 2 is a plan view enlarging a part of the solid-state imaging device.
Figure 3:
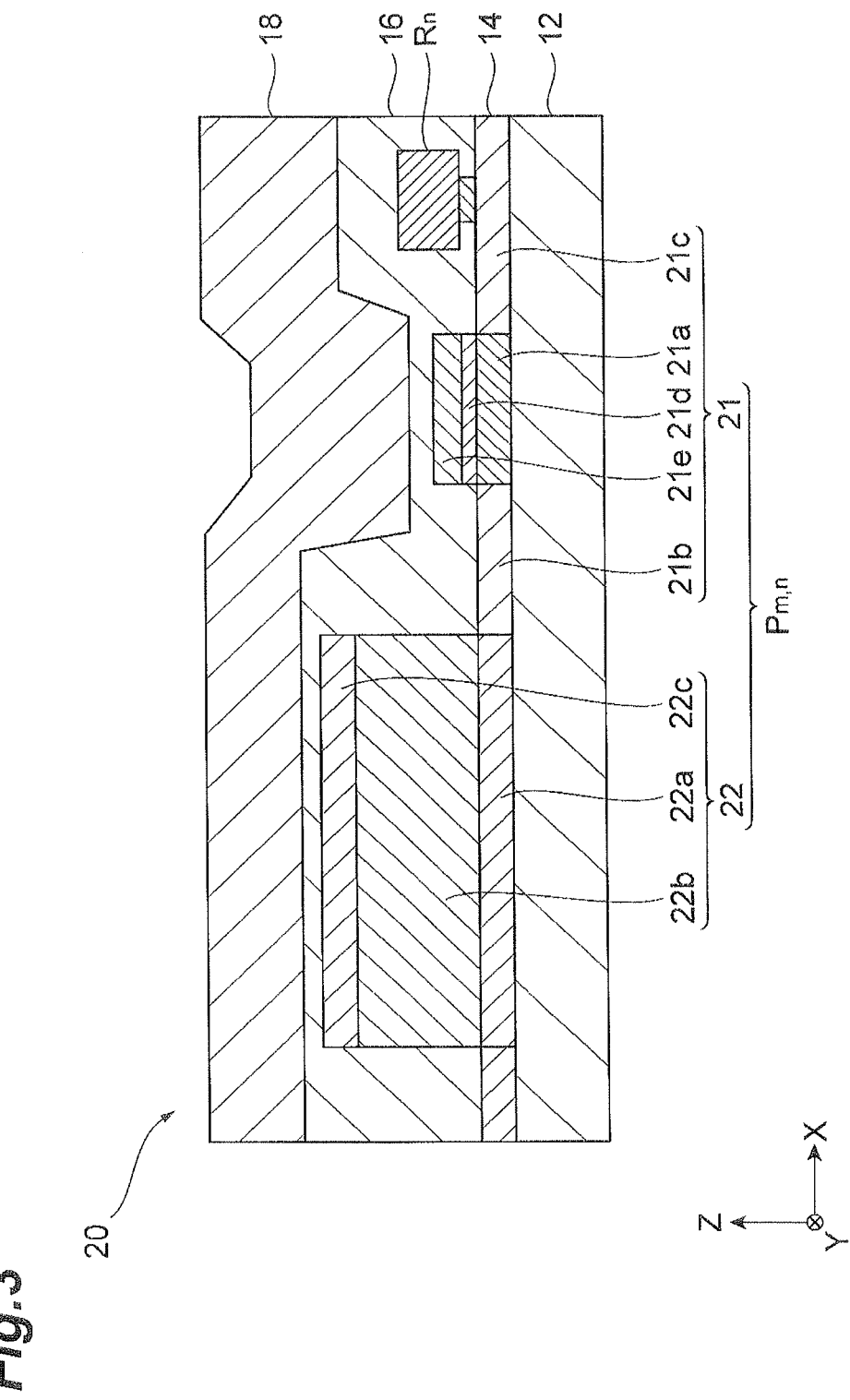
FIG. 3 is a side sectional view illustrating a cross section taken along the line I-I in FIG. 2.

FIG. 1 to FIG. 3 are diagrams illustrating the configuration of a solid-state imaging device 1A in this embodiment. FIG. 1 is a plan view illustrating the solid-state imaging device 1A, and FIG. 2 is a plan view enlarging a part of the solid-state imaging device 1A. FIG. 3 is a side sectional view illustrating a cross section taken along the line I-I of FIG. 2. FIG. 1 to FIG. 3 also depict an XYZ orthogonal coordinate system for easier understanding.

As illustrated in FIG. 1, the solid-state imaging device 1A comprises a sensor panel section 10 and readout circuit sections 40. The sensor panel section 10 is formed on a principal surface of a glass substrate 12 (first substrate), and has a photodetecting section 20 and a vertical shift register section 30. The vertical shift register section 30 is arranged along a side of the photodetecting section 20. Each readout circuit section 40 is disposed on a substrate 41 (second substrate) provided separately from the glass substrate 12 and is electrically connected to the photodetecting section 20 through a plurality of bonding wires 51. The readout circuit section 40 is favorably constituted by a CMOS-type IC chip, for example. The readout circuit section 40 includes a plurality of integration circuits provided so as to correspond to respective columns of the photodetecting section 20, and the integration circuits respectively generate voltage values according to amounts of charges output from pixels of their corresponding columns. The readout circuit section 40 holds the voltage values output from the integration circuits and sequentially outputs the held voltage values.

The photodetecting section 20 and vertical shift register section 30, which are disposed on the single glass substrate 12 in this embodiment, may be placed on respective glass substrates different from each other. A plurality of readout circuit sections 40, as illustrated in FIG. 1, or only one section may be provided.

The photodetecting section 20 is constructed by two-dimensionally arranging a plurality of pixels over a plurality of rows and a plurality of columns. The pixel $P_{m,n}$ illustrated in FIG. 2 is a pixel located on the m-th row and the n-th column. Here, m is an integer of 1 or more and M or less, and n is an integer of 1 or more and N or less. Each of M and N is an integer of 2 or more. In FIG. 2, the column direction coincides with the Y-axis direction, and the row direction coincides with the X-axis direction. Each of a plurality of pixels $P_{1,1}$ to $P_{M,N}$ included in the photodetecting section 20 comprises a thin-film transistor 21 and a photodiode 22. The thin-film transistor 21 has one current terminal electrically connected to the photodiode 22.

As illustrated in FIG. 2, the sensor panel section 10 of this embodiment further has a plurality of row selection lines $Q_1$ to $Q_M$ provided for the respective rows and a plurality of readout lines $R_1$ to $R_N$ provided for the respective columns. The row selection line $Q_m$ of the m-th row is electrically connected to the control terminal of the thin-film transistor 21 included in the pixel $P_{m,n}$ at the corresponding row. The readout line $R_n$ of the n-th row is electrically connected to the other current terminal of the thin-film transistor 21 included in the pixel $P_{m,n}$ at the corresponding column. The plurality of row selection lines $Q_1$ to $Q_M$ and plurality of readout lines $R_1$ to $R_N$ are made of a metal.

As illustrated in FIG. 3, an amorphous silicon film 14 is provided throughout a principal surface of the glass substrate 12. The thin-film transistor 21, photodiode 22, and n-th column readout line $R_n$ are formed on the surface of the amorphous silicon film 14. The thin-film transistor 21, photodiode 22, and n-th column readout line $R_n$ are covered with an insulating layer 16, on which a scintillator 18 is disposed so as to cover the whole surface of the glass substrate 12. The scintillator 18 generates scintillation light according to X-rays incident thereon, converts an X-ray image into a light image, and outputs the light image to the photodiodes 22.

The photodiode 22 generates charges by an amount corresponding to the intensity of light incident thereon and accumulates thus generated charges in a junction capacitance part. The photodiode 22 is a PIN photodiode having an n-type semiconductor layer 22a, an i-type semiconductor layer 22b, and a p-type semiconductor layer 22c. The n-type semiconductor layer 22a is a semiconductor layer made of n-type amorphous silicon. The i-type semiconductor layer 22b, which is a semiconductor layer made of i-type (undoped) amorphous silicon, is disposed on the n-type semiconductor layer 22a. Thus forming the i-type semiconductor layer 22b from amorphous silicon can make the i-type semiconductor layer 22b thicker, so as to enhance the photoelectric conversion efficiency of the photodiode 22, thereby improving the sensitivity of the solid-state imaging device 1A. The p-type semiconductor layer 22c, which is a semiconductor layer made of p-type amorphous silicon, is disposed on the i-type semiconductor layer 22b.

The thin-film transistor 21 is preferably constituted by a field-effect transistor (FET) but may also be constituted by a bipolar transistor. When the thin-film transistor 21 is an FET, the control terminal means a gate, and the current terminal means a source or drain, respectively, in the explanation of this embodiment. When the thin-film transistor 21 is a bipolar transistor, the control terminal means a base, and the current terminal means a collector or emitter.

The thin-film transistor 21 includes a region constituted by at least one of amorphous silicon and polycrystalline silicon. For example, the thin-film transistor 21 illustrated, in FIG. 3 has a channel region 21a, a source region 21b, and a drain region 21c which are made of amorphous silicon. The source region 21b is formed along one side face of the channel region 21a. The drain region 21c is formed along the other side face of the channel region 21a. A gate electrode 21e is disposed on the channel region 21a, while a gate insulating film 21d is interposed between the gate electrode 21e and channel region 21a.

While amorphous silicon is used for the channel region 21a, source region 21b, and drain region 21c in the thin-film transistor 21, low temperature polycrystalline silicon (LTPS) is used more preferably. The low temperature polycrystalline silicon is polycrystalline silicon which deposits at a relatively low process temperature, e.g., 100 to 600° C. Since such a low temperature enables the glass substrate 12 made of alkali-free glass, for example, to be utilized as a support substrate, constructing the above respective regions 21a, 21b, 21c from the low temperature polycrystalline silicon makes it possible to use the glass substrate 12 having an area larger than a monocrystalline silicon wafer as a support substrate, and produce the photodetecting section 20 having a large area on the glass substrate 12.

One example uses plate-shaped alkali-free glass (for substrates) having a thickness of 03 mm to 1.2 mm, for instance, as a material for the glass substrate 12. The alkali-free glass contains substantially no alkali and has stable characteristics with low expansion coefficient and high heat resistance. Since the low temperature polycrystalline silicon has an electron mobility of 10 to 600 $cm^2Ns$, which is higher than that of amorphous silicon (0.3 to 1.0 $cm^2/Vs$), the on-resistance of the thin-film transistor 21 can be lowered by forming the regions 21a, 21b, 21c of the thin-film transistor 21 from the low temperature polycrystalline silicon.

Figure 4:
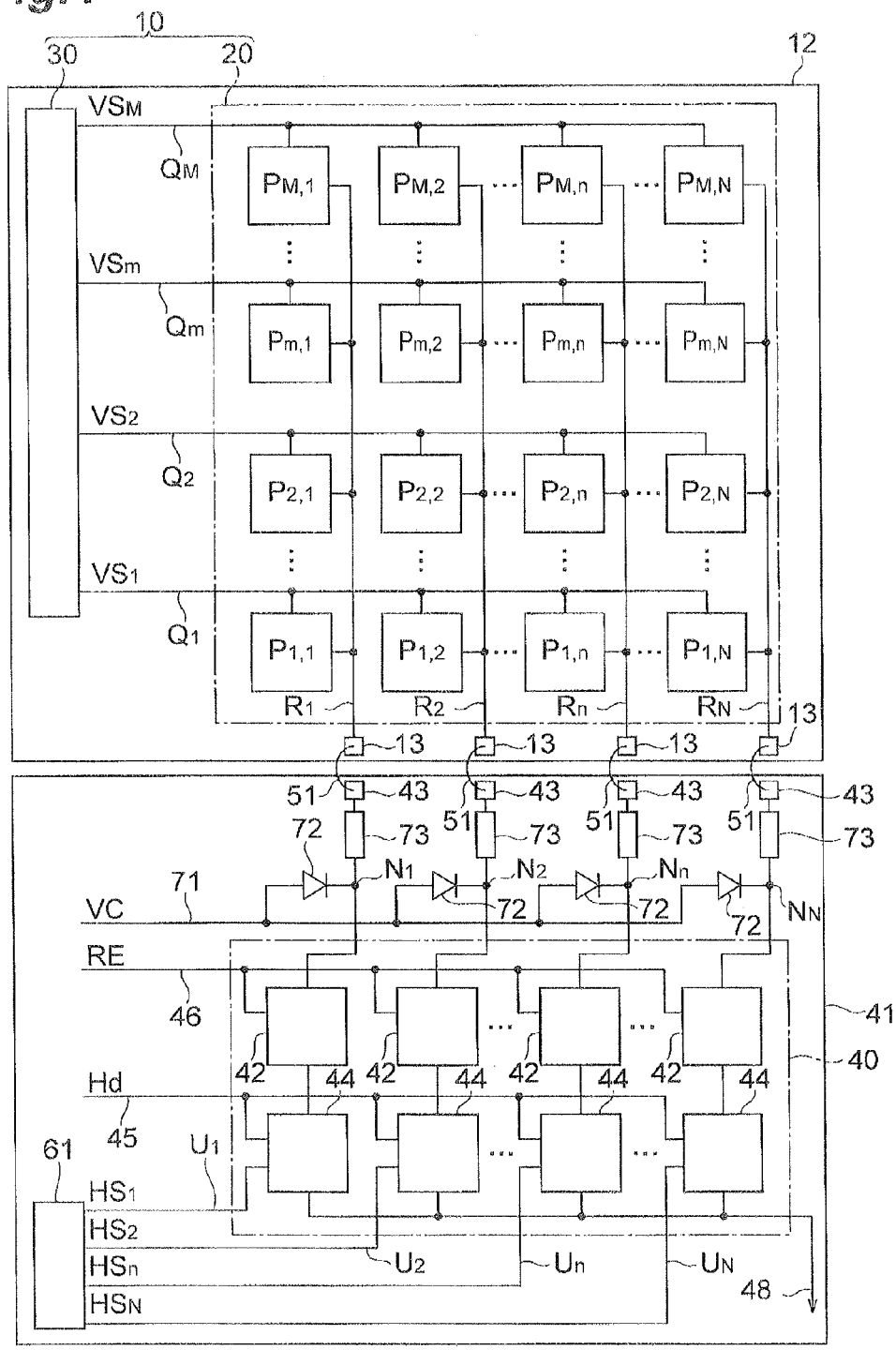
FIG. 4 is a diagram illustrating an inner configuration of a sensor panel section and a readout circuit section.

Circuit configurations of the sensor panel section 10 and readout circuit section 40 will now be explained in detail. FIG. 4 is a diagram illustrating an inner configuration of the sensor panel section 10 and readout circuit section 40. As described above, the photodetecting section 20 is constructed by two-dimensionally arraying M×N pixels $P_{1,1}$ to $P_{M,N}$ in M rows and N columns. The m-th row selection line $Q_m$ connected to N pixels $P_{m,1}$ to $P_{m,N}$ at the m-th row is connected to the vertical shift register section 30.

The readout circuit section 40 has a plurality of (N in this embodiment) integration circuits 42 provided for the respective columns and a plurality of (N in this embodiment) holding circuits 44. The integration circuit 42 and holding circuit 44 are connected to each other in series for each column. The N integration circuits 42 have a configuration in common. The N holding circuits 44 have a configuration in common.

The N integration circuits 42 have respective input terminals connected to the readout lines $R_1$ to $R_N$, accumulate charges input from the readout lines $R_1$ to $R_N$, and output respective voltage values corresponding to the amounts of accumulated charges from output terminals to the N holding circuits 44, The N integration circuits 42 are connected to a reset line 46 provided in common for the N integration circuits 42. The N holding circuits 44 have respective input terminals connected to the output terminals of the integration circuits 42, hold the voltage values input to the input terminals, and output the held voltage values from the output terminals to a voltage output line 48. The N holding circuits 44 are connected to a hold line 45 provided in common for the N holding circuits 44. The N holding circuits 44 are also connected to a horizontal shift register section 61 respectively through a first column selection line $U_1$ to an N-th column selection line $U_N$.

The vertical shift register section 30 provides the N pixels $P_{m,1}$ to $P_{m,N}$ at the m-th row with an m-th row selection control signal $VS_m$ through the m-th row selection line $Q_m$. In the vertical shift register section 30, the row selection control signals $VS_1$ to $VS_M$ sequentially become significant values (i.e., on-voltages of the control terminals of the thin-film transistors 21, an example of which is +10 V to +15 V). The horizontal shift register section 61 provides the N holding circuits 44 with column selection control signals $HS_1$ to $HS_N$ through the column selection lines $U_1$ to $U_N$, respectively. The column selection control signals $HS_1$ to $HS_N$ sequentially become significant values. Each of the N integration circuits 42 is provided with a reset control signal RE through the reset line 46. Each of the N holding circuits 44 is provided with a hold control signal Hd through the hold line 45.

As described above, the sensor panel section 10 is formed on the glass substrate 12, while the readout circuit section 40 is provided on the substrate 41. For their interconnection, a plurality of (N in this embodiment) panel-side connection points 13 are provided on the glass substrate 12, and a plurality of (N in this embodiment) readout-section-side connection points 43 are provided on the substrate 41. The N panel-side connection points 13 are electrically connected to respective one ends of the N readout lines $R_1$ to $R_N$. The N readout-section-side connection points 43 are electrically connected to respective input terminals of the N integration circuits 42. The panel-side connection points 13 and readout-section-side connection points 43 are constructed by bonding pads, for example. The panel-side connection points 13 and readout-section-side connection points 43 are electrically connected to each other through the bonding wires 51.

A constant potential line 71 is disposed on the substrate 41. The potential of the constant potential line 71 is held at a constant potential VC. The constant potential VC is preferably set equal to or near the potential of an input terminal of an amplifier (which will be explained later) constituting the integration circuit 42, for example.

N nodes $N_1$ to $N_N$ exist respectively between the N panel-side connection points 13 and N integration circuits 42. N rectifier circuits 72 are respectively connected between the nodes $N_1$ to $N_N$ and constant potential line 71. The N rectifier circuits 72 are disposed on the substrate 41 and can be constructed by horizontal pn-junction diodes or vertical pn-junction diodes, for example. When the potential of nonselected row selection lines $Q_1$ to $Q_M$ (i.e., the off-voltage of the control terminal of the thin-film transistor 21) is lower than the constant potential VC, the cathode of the diode is electrically connected to the node $N_{11}$ of the column and the anode is electrically connected to the constant potential line 71. When the potential of nonselected row selection lines $Q_1$ to $Q_M$ is higher than the constant potential VC, the cathode of the diode is electrically connected to the constant potential line 71 and the anode is electrically connected to the node $N_n$ of the column.

When the thin-film transistor 21 includes a region constituted by amorphous silicon or polycrystalline silicon, the off-voltage of the control terminal of the thin-film transistor 21 is likely to become negative (e.g., −5 V to −10 V). This is because amorphous silicon and polycrystalline silicon have crystallinity lower than that of monocrystalline silicon and contain a large amount of impurities, which makes it necessary to apply a relatively large voltage to the control terminal. On the other hand, the potential at an input terminal of an amplifier constituting the integration circuit 42 is a positive potential, a typical example of which is 1.0 V. Therefore, in this case, the cathode of the diode constituting the rectifier circuit 72 is electrically connected to the node $N_n$ and the anode is electrically connected to the constant potential line 71.

A plurality of (N in this embodiment) circuit elements 73 each having a resistance component are connected respectively between the nodes $N_1$ to $N_N$ and readout lines $R_1$ to $R_N$. The circuit elements 73 have one terminals electrically connected to the readout lines $R_1$ to $R_N$ through the readout-section-side connection points 43, bonding wires 51, and panel-side connection points 13. The circuit elements 73 have the other terminals electrically connected to the input terminals of the integration circuits 42 through the nodes $N_1$ to $N_N$. In this embodiment, the N circuit elements 73 are disposed on the substrate 41. The resistance value of each circuit element 73 is 1 kΩ, for example.

FIG. 5 is a diagram illustrating examples of the circuit elements 73. (a) in FIG. 5 illustrates a case where the circuit element 73 includes a region 73a having a resistance component. Such a region 73a is favorably realized by a region comprising at least one of amorphous silicon and polycrystalline silicon, a region in which an n-type dopant or p-type dopant is diffused at a high concentration, or a well resistance region, for example.

(b) in FIG. 5 illustrates a transistor 73b as the circuit element 73. The transistor 73b, when a certain bias voltage is applied to the control terminal, can function as the circuit element 73 having a resistance component (on-resistance) to a certain extent. That is, the resistance value of the transistor is very small when the on-voltage is applied to the control terminal, and very large when the off-voltage is applied to the control terminal. Therefore, the resistance value of the transistor 73b can be adjusted to an appropriate value by applying a voltage between the on-voltage and off-voltage to the control terminal. Using the transistor as a resistance component can realize a large resistance value with a relatively small area.

Figure 6:
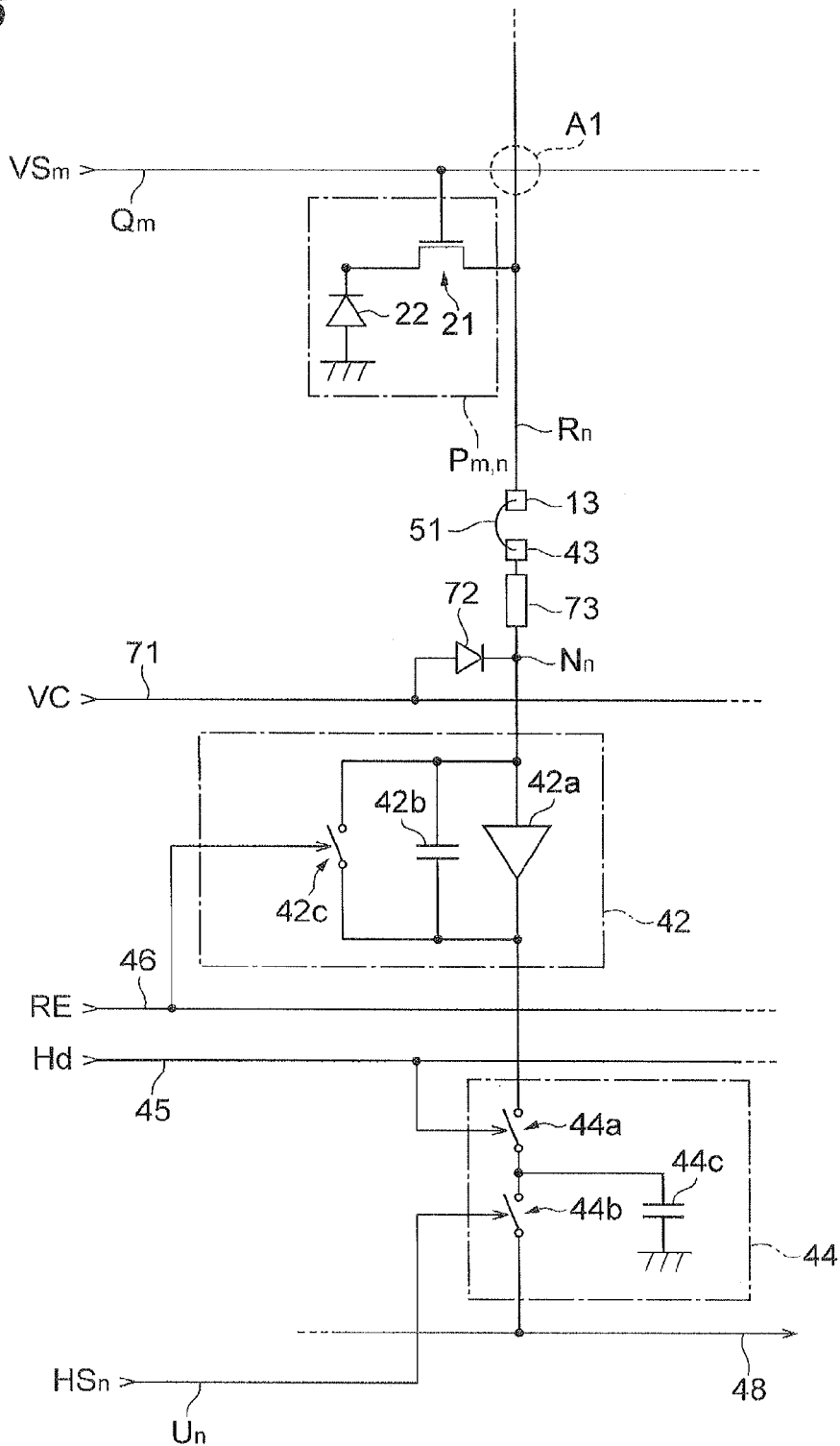
FIG. 6 is a diagram illustrating a detailed circuit configuration example of a pixel $P_{m,n}$, an integration circuit, and a holding circuit which are included in the n-th column.

FIG. 6 is a diagram illustrating a detailed circuit configuration example of the pixel $P_{m,n}$, integration circuit 42, and holding circuit 44 included in the n-th column. Here, it illustrates a circuit diagram of the pixel $P_{m,n}$ at the m-th row and the n-th column as a representative of M×N pixels $P_{1,1}$ to $P_{M,N}$.

As illustrated in FIG. 6, the photodiode 22 of the pixel $P_{m,n}$ has a grounded anode terminal and a cathode terminal connected through the thin-film transistor 21 to the readout line $R_n$. The thin-film transistor 21 of the pixel $P_{m,n}$ is provided with the m-th row selection control signal $VS_m$, from the vertical shift register section 30 through the m-th row selection line $Q_m$. The m-th row selection control signal $VS_m$ instructs the respective thin-film transistors 21 included in the N pixels $P_{m,1}$ to $P_{m,N}$ at the m-th row to open/close.

When the m-th row selection control signal $VS_m$ is a non-significant value (the off-voltage of the control terminal of the thin-film transistor 21), for example, the thin-film transistor 21 is turned off. At this time, charges generated in the photodiode 22 are accumulated in the junction capacitance part of the photodiode 22 without being output to the readout line $R_n$. When the m-th row selection control signal $VS_m$ is a significant value (the on-voltage of the control terminal of the thin-film transistor 21), on the other hand, the thin-film transistor 21 is turned on. At this time, charges accumulated in the junction capacitance part of the photodiode 22 are output through the thin-film transistor 21 to the readout line $R_n$. The charges are sent to the integration circuit 42 through the readout line $R_n$, bonding wire 51, circuit element 73, and node $N_n$.

The integration circuit 42 has a so-called charge integration type configuration including an amplifier 42a, a capacitive element 42b, and a discharge switch 42c. The capacitive element 42b and discharge switch 42c are connected in parallel with each other between the input terminal and output terminal of the amplifier 42a. The amplifier 42a has an input terminal connected to the readout line $R_n$. The discharge switch 42c is provided with the reset control signal RE through the reset line 46.

The reset control signal RE instructs the respective discharge switches 42c of the N integration circuits 42 to open/close. For example, when the reset control signal RE is a non-significant value (e.g., high level), the discharge switch 42c closes, so as to discharge the capacitive element 42b, thereby initializing the output voltage value of the integration circuit 42. When the reset control signal RE is a significant value (e.g., low level), the discharge switch 42c opens, so that the charges input to the integration circuit 42 are accumulated in the capacitive element 42b, whereby a voltage value corresponding to the amount of accumulated charges is output from the integration circuit 42.

The holding circuit 44 includes an input switch 44a, an output switch 44b, and a capacitive element 44c. One end of the capacitive element 44c is grounded. The other end of the capacitive element 44c is connected to the output terminal of the integration circuit 42 through the input switch 44a and also connected to the voltage output line 48 through the output switch 44b. The input switch 44a is provided with the hold control signal Hd through the hold line 45. The hold control signal Hd instructs the respective input switches 44a of the N holding circuits 44 to open/close. The output switch 44b of the holding circuit 44 is provided with the n-th column selection control signal $HS_n$ through the n-th column selection line $U_n$. The selection control signal $HS_n$ instructs the output switch 44b of the holding circuit 44 to open/close.

When the hold control signal Hd changes from the high level to the low level, for example, the input switch 44a changes from the closed state to the open state, whereupon the voltage value input to the holding circuit 44 is held by the capacitive element 44c. When the n-th column selection control signal $HS_n$ changes from the low level to the high level, the output switch 44b is closed, whereupon the voltage value held by the capacitive element 44c is output to the voltage output line 48.

Figure 7:
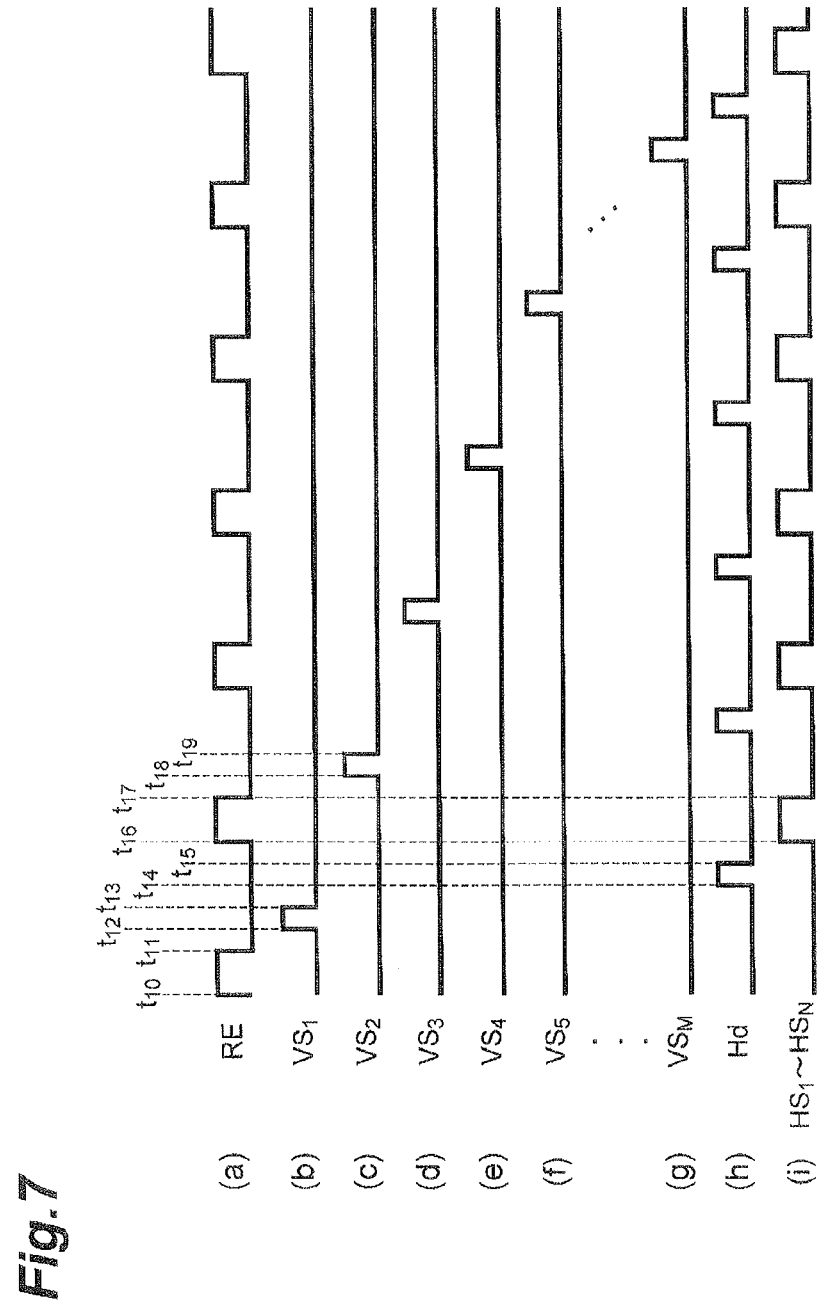
FIG. 7 is a timing chart of respective signals.

FIG. 7 is a timing chart of respective signals. FIG. 7 illustrates, successively from the upper side, (a) reset control signal RE, (b) first row selection control signal $VS_1$, (c) second row selection control signal $VS_2$, (d) third row selection control signal $VS_3$, (e) fourth row selection control signal $VS_4$, (f) fifth row selection control signal $VS_5$, (g) M-th row selection control signal $VS_M$, (h) hold control signal Hd, and (i) first column selection control signal $HS_1$ to N-th column selection control signal $HS_N$.

First, during a period from time $t_{10}$ to time $t_{11}$, the reset control signal RE is set to the high level. This closes the discharge switch 42c in each of the N integration circuits 42, so as to discharge the capacitive element 42b.

During a period from time $t_{12}$ after time $t_{11}$ to time $t_{13}$, the vertical shift register section 30 sets the first row selection control signal $VS_1$ to the high level. This turns the thin-film transistors 21 in the pixels $P_{1,1}$ to $P_{1,N}$ at the first row into connected states, whereby the charges accumulated in the respective photodiodes 22 of the pixels $P_{1,1}$ to $P_{1,N}$ are output through the readout lines $R_1$ to $R_N$ to the integration circuits 42 and accumulated in the capacitive elements 42b. The integration circuits 42 output voltage values having magnitudes corresponding to the amounts of charges accumulated in the capacitive elements 42b. After time $t_{13}$, the respective thin-film transistors 21 of the pixels $P_{1,1}$ to $P_{1,N}$ at the first row are turned into unconnected states.

During a period from time $t_{14}$ after time $t_{13}$ to time $t_{15}$, the hold control signal Hd is set to the high level, whereby the input switch 44a in each of the N holding circuits 44 is turned into the connected state, whereby the voltage value output from the integration circuit 42 is held by the capacitive element 44c.

Subsequently, during a period from time $t_{16}$ after time $t_{15}$ to time $t_{17}$, the horizontal shift register section 61 turns the first column selection control signal $HS_1$ to N-th column selection control signal $HS_N$ into the high levels in sequence. This successively closes the output switches 44b of the N holding circuits 44, whereby the voltage values held by the capacitive elements 44c are sequentially output to the voltage output line 48. During this period, the reset control signal RE is set to the high level, whereby the capacitive element 42b of each integration circuit 42 is discharged.

Next, during a period from time $t_{18}$ after time $t_{17}$ to time $t_{19}$, the vertical shift register section 30 sets the second row selection control signal $VS_2$ to the high level. This turns the transistors 21 into the connected states in the pixels $P_{2,1}$ to $P_{2,N}$ at the second row, whereby the charges accumulated in the respective photodiodes 22 in the pixels $P_{2,1}$ to $P_{2,N}$ are output through the readout lines $R_1$ to $R_N$ to the integration circuits 42 and accumulated in the capacitive elements 42b. Subsequently, an operation similar to that at the first row successively outputs the voltage values having magnitudes corresponding to the amounts of charges accumulated in the capacitive elements 42b from the N holding circuits 44 to the voltage output line 48. Operations similar to that at the first row also convert the charges accumulated in the pixels at the third row to M-th row into voltage values and successively output them to the voltage output line 48. This completes the readout of image data by one image frame from the photodetecting section 20.

Figure 8:
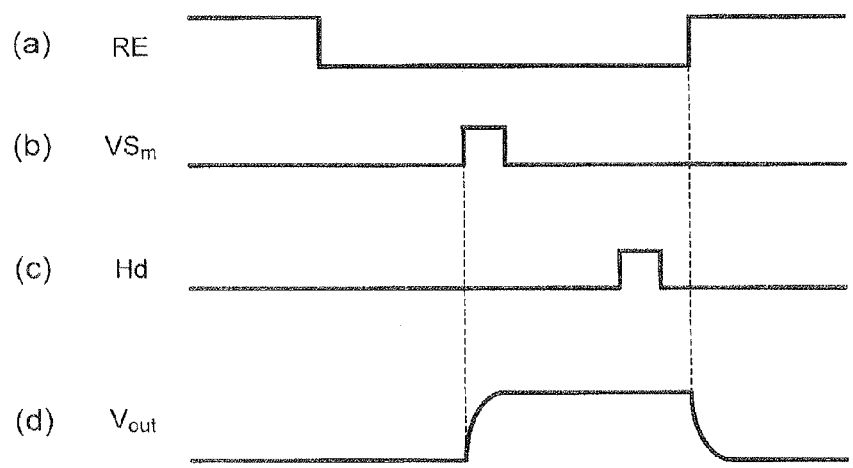
FIG. 8 is a timing chart representing operations for one row in the operations illustrated in FIG. 7.

FIG. 8 is a timing chart representing operations for one row in the operations illustrated in FIG. 7. FIG. 8 illustrates, successively from the upper side, (a) reset control signal RE, (b) m-th row selection control signal $VS_m$, (c) hold control signal Hd, and (d) output voltage $V_{out}$ from the integration circuit 42. As described above, when the m-th row selection control signal $VS_m$ attains the high level, the charges accumulated in the respective photodiodes 22 of the pixels $P_{m,1}$ to $P_{m,N}$ are output through the readout lines $R_1$ to $R_N$ to the integration circuits 42 and accumulated in the capacitive elements 42b. The integration circuits 42 output voltage values $V_{out}$ having magnitudes corresponding to the respective amounts of charges accumulated in the capacitive elements 42b.

Figure 9:
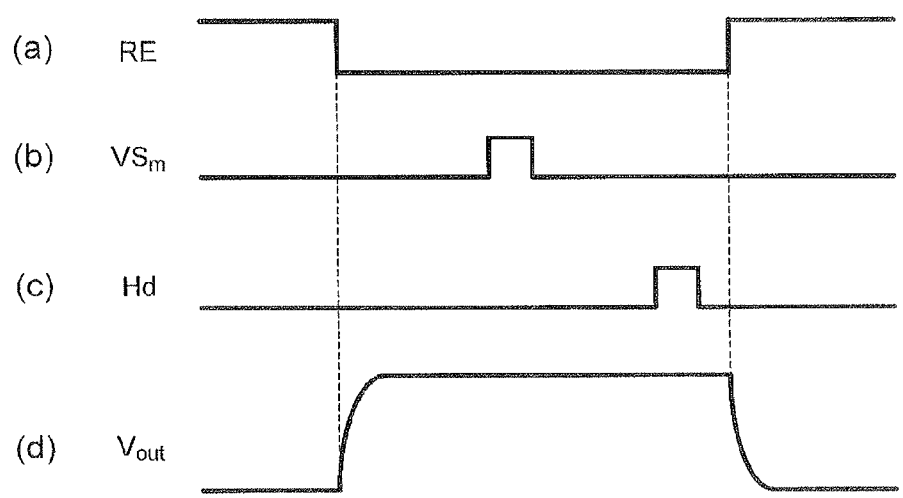
FIG. 9 is a timing chart in a case without rectifier circuits and circuit elements as a comparative example.

Suppose a case where a short-circuited failure occurs in a part where the row selection line $Q_m$ and readout line $R_n$ intersect as illustrated in FIG. 6 (part A1 in the drawing). FIG. 9 illustrates a timing chart in a case without the rectifier circuit 72 and circuit element 73 as a comparative example of this embodiment.

When the row selection line $Q_m$ and readout line $R_n$ are short-circuited to each other, the potential of the readout line $R_n$ is drawn to that of the row selection line $Q_m$ (i.e., the potential of the control terminal of the thin-film transistor 21). While the potential of the control terminal of the thin-film transistor 21 is about +10 V and about −5 V, for example, when it is on and off, respectively, the on-time is short (e.g., several microseconds in one frame), whereas the off-time is long. Therefore, the potential of the readout line $R_n$ is mainly drawn to the off-voltage of the control terminal of the thin-film transistor 21. When the rectifier circuit 72 and circuit element 73 are not provided, excessive charges caused by such a potential always flow into the amplifier 42a of the integration circuit 42. Consequently, the voltage value $V_{out}$ output from the charge integration type amplifier 42a scales out to the maximum output value and attains a supersaturated state as illustrated in (d) in FIG. 9.

When such an abnormal output voltage value $V_{out}$ occurs in only one column, the pixel value of this column can be interpolated by using pixel values of its nearby columns. When such an output abnormal value of the integration circuit 42 is too large, however, it may also affect operations of other integration circuits 42 adjacent thereto, whereby output voltage values from the other integration circuits 42 may also become abnormal values. According to the knowledge of the inventors, such abnormality may extend to about 10 columns on both sides of the column. When the output voltage values of a plurality of continuous columns are abnormal values as above, pixel values of these columns are hard to interpolate.

For such a problem, the solid-state imaging device 1A of this embodiment connects the rectifier circuit 72 between the node $N_n$, between the panel-side connection point 13 and integration circuit 42, and the constant potential line 71, The circuit element 73 having a resistance component is further connected between the node $N_n$ and the readout line $R_n$.

When the row selection line $Q_m$ and readout line $R_n$ are short-circuited to each other at the n-th column, the potential of the readout line $R_n$ is drawn to that of the row selection line $Q_m$ (the potential of the control terminal of the thin-film transistor 21) as described above, which applies a forward direction voltage to the rectifier circuit 72, thereby turning on the rectifier circuit 72. At this time, a current flowing from the constant potential line 71 to the row selection line $Q_m$ passes through the circuit element 73 having a resistance component.

Figure 10:
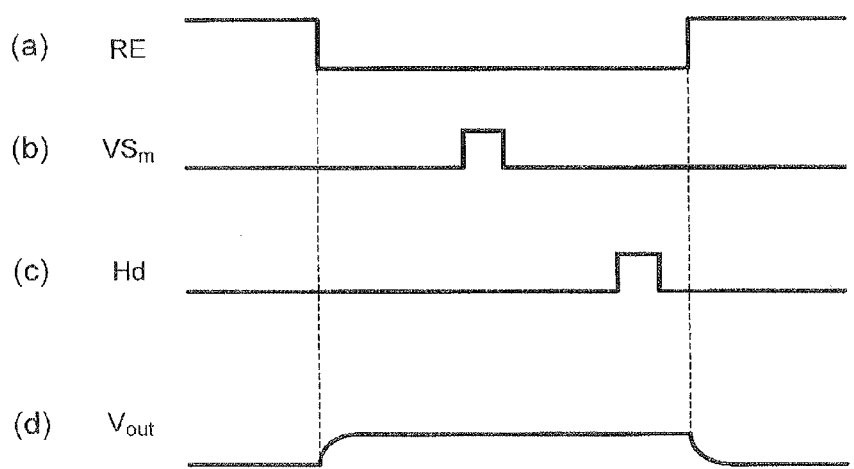
FIG. 10 is a timing chart in a case where a short circuit occurs.

This restricts the magnitude of the current, while the potential of the wiring line located closer to the integration circuit 42 with respect to the circuit element 73, i.e., the potential at the input terminal of the amplifier 42a, is held at the potential of the constant potential line 71 (a potential obtained by subtracting therefrom the voltage drop caused by the rectifier circuit 72 to be exact). When the rectifier circuit 72 is provided alone without the circuit element 73, the current cannot be restricted in front of the rectifier circuit 72, whereby the potential cannot be adjusted. In the case where the rectifier circuit 72 is a diode, its voltage drop is about 0.7 V, whereby the potential of the input terminal of the amplifier 42a is about 0.3 V when the potential of the constant potential line 71 is 1.0 V. Therefore, as illustrated in FIG. 10, the voltage value $V_{out}$ output from the amplifier 42a can become a stable low value.

Thus, the solid-state imaging device 1A of this embodiment can inhibit the output abnormal value of the integration circuit 42 from becoming too large at the column where the row selection line $Q_m$ and readout line R are short-circuited to each other. This can reduce influence over operations of the other integration circuits 42, thereby preventing output voltage values from the other integration circuits 42 from becoming abnormal.

When a short circuit occurs between a row selection line and a readout line, a line between the readout line and an integration circuit may be cut with a laser and the like as described in Patent Literature 1, for example. However, a man-hour is required for finding and cutting the readout line where the short circuit occurred, and it is not easy to accurately select and cut the readout line where the short circuit occurred. The part to cut in the line is exposed by opening a protective film (passivation film), which may corrode the line depending on the scintillator and surrounding environment and cause a fear of reliability lowering because of damages caused by the laser. It further necessitates appropriate equipment for cutting, which is problematic in that it cannot readily deal with short circuits occurring when the device is in use.

In the solid-state imaging device 1A of this embodiment, when a short circuit occurs between the row selection line $Q_m$ and readout line $R_n$, the rectifier circuit 72 automatically turns on, whereby the input potential to the integration circuit 42 at this column is automatically held at a predetermined value. This makes it unnecessary to perform such an operation of selecting the readout line where the short circuit occurred as described in Patent Literature 1 and prevents readout lines of normal columns from being cut in error. There is no need for fears of lines being corroded, damaged, and so forth. Any short circuit occurring when the device is in use can readily (automatically) be dealt with.

Even when a separation circuit is provided between a readout line and an integration circuit as described in Patent Literature 2, if the off-voltage of the row selection line is outside of an operation voltage range (e.g., a negative voltage) of the separation circuit (switch), for example, the separation circuit constituted by a logic circuit will not function, whereby the sensor panel section and readout circuit section cannot electrically be separated from each other. In particular, when amorphous silicon or polycrystalline silicon is used for the thin-film transistor 21 as in this embodiment, the voltage width between the on-voltage and off-voltage of the control terminal is likely to become larger because of low crystallinity of amorphous silicon and polycrystalline silicon. Therefore, the off-voltage of the control terminal of the thin-film transistor 21 is likely to be out of the operation voltage range of the separation circuit (switch). Unlike the method described in Patent Literature 2, the solid-state imaging device 1A of this embodiment can favorably exhibit the effects described above by setting the potential of the constant potential line 71 to an appropriate positive value even when the potential of the row selection line $Q_m$ is negative.

In this embodiment, the rectifier circuits 72 are not disposed on the glass substrate 12, but are connected between the nodes $N_1$ to $N_N$ between the panel-side connection points 13 and integration circuits 42 and the constant potential line 71. Providing a plurality of rectifier circuits 72 on the glass substrate 12 complicates the circuit configuration on the glass substrate 12, thereby raising the failure rate of circuit structures on the glass substrate 12 including the sensor panel section 10. Higher failure rate is unfavorable in particular in the sensor panel section employing a thin-film transistor, which tends to have a large area. Arranging the rectifier circuits 72 as described above can simplify the circuit configuration on the glass substrate 12 and lower the failure rate.

Preferably, a plurality of rectifier circuits 72 and the constant potential line 71 are disposed on the substrate 41 as in this embodiment. This makes it possible for the rectifier circuits 72 and integration circuits 42 to be integrated on one semiconductor substrate (e.g., silicon monocrystalline substrate), for example, so as to cut down steps of manufacturing the solid-state imaging device 1A. When the amorphous silicon film 14 is provided on the principal surface of the glass substrate 12 as in this embodiment, it is preferable for the rectifier circuits 72 to be formed on a semiconductor substrate (e.g., silicon monocrystalline substrate) formed with the integration circuits 42 rather than on the glass substrate 12. This can form the rectifier circuits 72 easily. Not providing a plurality of rectifier circuits 72 on the glass substrate 12 can simplify the circuit configuration of the glass substrate 12 and lower the failure rate. When a plurality of substrates 41 are provided as illustrated in FIG. 1 in particular, providing the rectifier circuits 72 on the substrate 41 can minimize parts to be discarded when the rectifier circuit 72 fails.

As in this embodiment, the thin-film transistor 21 may include a region constituted by at least one of amorphous silicon and polycrystalline silicon. The off-voltage of the control terminal of such a thin-film transistor 21 is likely to be negative. Even in such a case, the solid-state imaging device 1A can favorably exhibit the above-described effects by setting the potential of the constant potential line 71 to a positive appropriate value.

Preferably, the circuit elements 73 are disposed on the substrate 41 as in this embodiment. This can integrate the circuit element 73 and integration circuit 42 on one semiconductor substrate, for example, thereby cutting down the steps of manufacturing the solid-state imaging device 1A.

As illustrated in (a) in FIG. 5, the circuit element 73 may include a region 73a constituted by at least one of amorphous silicon and polycrystalline silicon. The circuit element 73 can easily be made by using amorphous silicon and polycrystalline silicon, which have a resistance value higher than that of monocrystalline semiconductors, as its material. Such a circuit element 73 can easily be made on the glass substrate 12 in particular when a region constituted by at least one of amorphous silicon and polycrystalline silicon is included on the glass substrate 12 as in this embodiment.

As illustrated in (b) in FIG. 5, the circuit element 73 may be constituted by the transistor 73b. This makes it possible to produce the circuit element 73 easily by using a process similar to a semiconductor process for making semiconductor circuits such as the thin-film transistors 21 on the glass substrate 12 and the integration circuits 42 on the substrates 41.

The off-voltage of the control terminal of the thin-film transistor 21 may be a negative voltage as in this embodiment. The solid-state imaging device 1A of this embodiment can favorably exhibit the above-described effects by setting the potential of the constant potential line 71 to an appropriate positive value also in such a case.

In this embodiment, the channel region 21a, source region 21b, and drain region 21c of the thin-film transistor 21 are made of amorphous silicon. In recent years, wider photodetecting surfaces have been demanded for solid-state imaging elements such as two-dimensional flat panel image sensors used for medical purposes (such as dental X-ray photography), for example. However, making a photodetecting section on a monocrystalline silicon wafer as in a conventional solid-state imaging element restricts the area of the photodetecting surface of the solid-state imaging element because of the size of a monocrystalline silicon wafer whose diameter is 12 inches at a maximum.

By contrast, producing a film of amorphous silicon on an insulating substrate such as a glass substrate, for example, and forming electronic components such as photodiodes and other transistors on an amorphous silicon surface can make the photodetecting surface much wider than that of the conventional solid-state imaging element formed by using a monocrystalline silicon wafer. In this embodiment, the channel region 21a, source region 21b, and drain region 21c of the thin-film transistor 21 may be constituted by polycrystalline silicon or both of amorphous silicon and polycrystalline silicon.

First Modified Example

Figure 11:
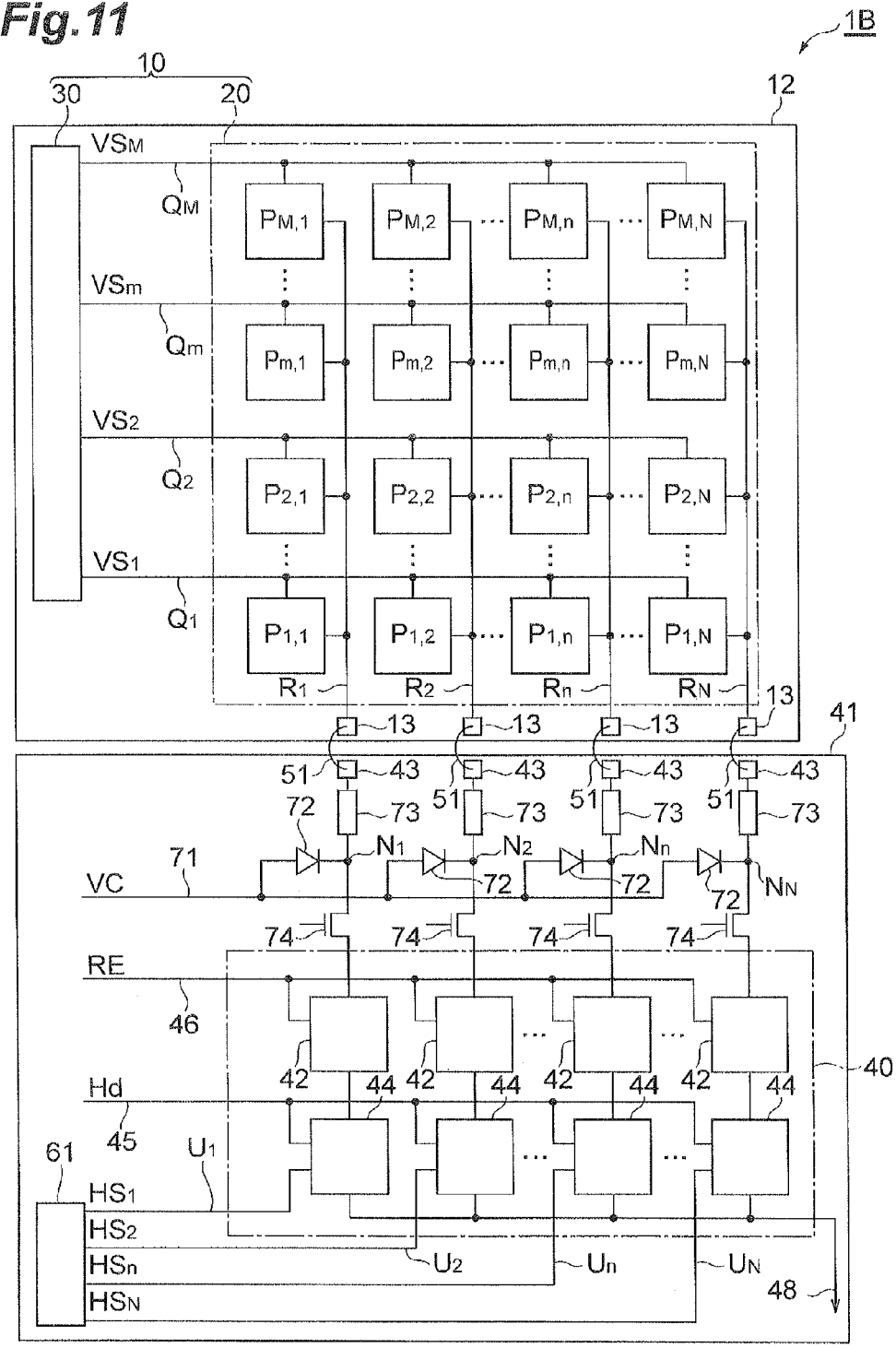
FIG. 11 is a diagram illustrating a configuration of the solid-state imaging device in accordance with a first modified example.

FIG. 11 is a diagram illustrating a configuration of a solid-state imaging device 1B in accordance with a first modified example of the above-described embodiment. The solid-state imaging device 1B of this modified example differs from the solid-state imaging device 1A of the above-described embodiment in that N switch circuits 74 are respectively connected between the nodes $N_1$ to $N_N$ and N integration circuits 42. The N switch circuits 74 are favorably constituted by FETs, for example. In one example, the switch circuit 74 is an nMOS-type FET. In this modified example, when a short-circuited failure occurs between the row selection line $Q_m$ and readout line $R_n$ at a certain column, the switch circuit 74 at this column is turned off. This can completely separate the fluctuation of the potential of the readout line $R_n$ caused by the short circuit between the row selection line $Q_m$ and readout line $R_n$ from the potential at the input terminal of the amplifier 42a.

Even when the off-voltage of the control terminal of the thin-film transistor 21 is a negative voltage, the potential between the nodes $N_1$ to $N_N$ and the integration circuits 42 at the time of a short circuit can be kept at a positive potential by the constant potential line 71 in this solid-state imaging device 1B as in the above-described embodiment. Therefore, even when the operation voltage range of the switch circuit 74 is a positive voltage (e.g., 0 V to 5 V), for example, the switch circuit 74 can be operated favorably. When the switch circuit 74 is an FET, even if it is not turned off, the on-resistance of the FET may fully restrict the current flowing from the input terminal of the amplifier 42a.

Second Modified Example

Figure 12:
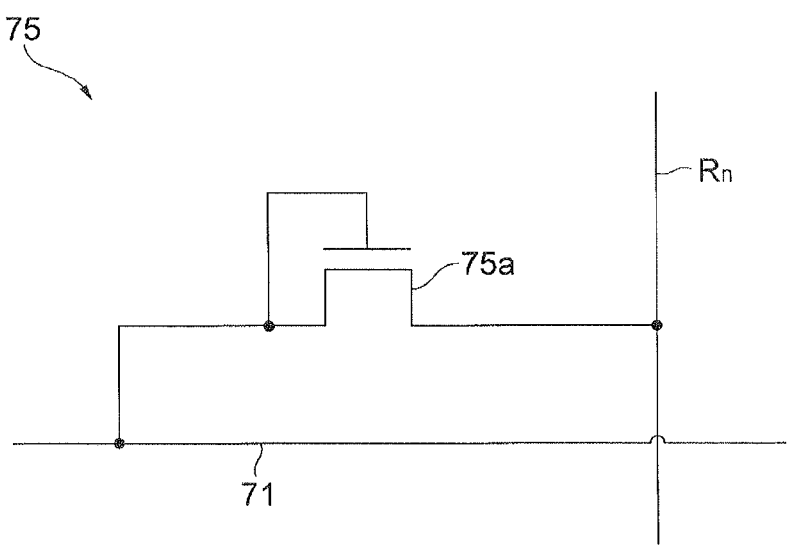
FIG. 12 is a circuit diagram illustrating a configuration of a rectifier circuit as a second modified example.

FIG. 12 is a circuit diagram illustrating a configuration of a rectifier circuit 75 as a second modified example of the above-described embodiment. The rectifier circuit 75 of this modified example is constructed by a transistor 75a. As illustrated in FIG. 12, the control terminal and one current terminal of the transistor 75a are short-circuited to each other (so-called diode connection), so as to realize a function identical to that of a diode. Such a rectifier circuit 75 can replace the rectifier circuit 72 in the above-described embodiment.

Third Modified Example

FIG. 13 is a diagram illustrating examples of electric connection structures between the sensor panel section 10 and readout circuit section 40 as a third modified example of the above-described embodiment. In the example illustrated in (a) in FIG. 13, the sensor panel section 10 and readout circuit section 40 are juxtaposed with each other on a base substrate 80. A panel-side connection point 13 connected to the sensor panel section 10 and a readout-section-side connection point 43 connected to the readout circuit section 40 are connected to each other through a bonding wire 51. Another connection point 47 on the substrate 41 is connected to a line on the base substrate 80 through a bonding wire 52. The connection point 47 is connected to the voltage output line 48 illustrated in FIG. 4, for example.

In the example illustrated in (b) in FIG. 13, the sensor panel section 10 is mounted on a principal surface 80a of the base substrate 80, while the readout circuit section 40 is arranged on the rear surface 80b of the base substrate 80. A panel-side connection point 13 of the sensor panel section 10 and a readout-section-side connection point 43 of the readout circuit section 40 are electrically connected to each other through a flexible substrate 81.

Without being limited to the above-described embodiment, various structures can be employed as electric connection structures between the sensor panel section 10 and readout circuit section 40 as in these modified examples.

The solid-state imaging device in accordance with the present invention is not limited to the above-described embodiment and modified examples, but can be modified in various manners. For example, while the above-described embodiment and modified examples illustrate examples in which the present invention is applied to a solid-state imaging device constructed by forming a film of amorphous silicon or polycrystalline silicon on a glass substrate, the present invention is not limited to such a configuration, but is also applicable to, for example, a solid-state imaging element made on a monocrystalline silicon substrate.

While the circuit element 73 having a resistance component is provided separately from other circuit parts in the above-described embodiment and modified examples, the circuit element in the present invention may be constructed by existing circuit components connected between nodes $N_1$ to $N_N$ and readout lines $R_1$ to $R_N$.

In the configuration illustrated in (a) in FIG. 13, for example, the bonding wire 51 has a resistance component in proportion to its length. In the configuration illustrated in (b) in FIG. 13, for example, a wiring line of the flexible substrate 81 has a resistance component in proportion to its length. When other connection structures such as bump connections and ACFs (anisotropic conductive films) are provided between the sensor panel section 10 and readout circuit section 40, such structures also have a resistance component. Therefore, these connection structures can also act as circuit elements in the present invention. When such existing circuit components can act as the circuit element in the present invention, it is not necessary to provide the circuit element 73 separately.

When the circuit element of the present invention is constituted by wiring resistance in wire bonding and the like connected between the nodes $N_1$ to $N_N$ and readout lines $R_1$ to $R_N$ in the above-described embodiment and modified examples, the wiring resistance preferably has a resistance value of several hundred Ω or larger. While the wiring resistance is several 52 in normal wire bonding, employing such a large wiring resistance (e.g., 100 times that of the normal wiring line or larger) in the circuit element of the present invention can favorably exhibit operations and effects of the above-described embodiment and modified examples.

When the switch circuit 74 is provided as in the first modified example, the resistance value of the circuit element is only required to be such a value that the voltage value between the circuit element and the switch circuit 74 is within an operation voltage range of the switch circuit 74 (e.g., 0 to 5 V). Further, the resistance value of the circuit element of the present invention is preferably such a value that the voltage value between the circuit element and the amplifier 42a is closer to the input voltage of the amplifier 42a than the off-voltage of the control terminal of the thin-film transistor. In the above-described embodiment, for example, the voltage value between the circuit element and the amplifier 42a is about 0.3 V, while the off-voltage of the control terminal of the thin-film transistor is −5 V. The resistance value of the circuit element of the present invention is also preferably such a value that the voltage value between the circuit element and the amplifier 42a is 0 V or higher when the off-voltage of the control terminal of the thin-film transistor is a negative voltage.

While the rectifier circuit 72 and circuit element 73 are provided on the substrate 41 (second substrate) in the above-described embodiment and modified examples, the circuit element may be provided on the first substrate. Or, at least one of the rectifier circuit and circuit element may be provided on a third substrate electrically connected between the first and second substrates.

While the above-described embodiment and modified examples illustrate a case where the off-voltage of the control terminal of the thin-film transistor is a negative voltage, the off-voltage may also be a positive voltage. In this case, the rectifier circuit is oriented in the opposite direction. That is, in order for a current to flow into the constant potential line from a node between a panel-side connection point and an integration circuit, the anode of the rectifier circuit is connected to the node, and the cathode of the rectifier circuit is connected to the constant potential line.

The solid-state imaging device in accordance with the above-described embodiment uses a configuration comprising a sensor panel section formed on a first substrate, and having a photodetecting section constructed by two-dimensionally arraying pixels, each including a photodiode and a thin-film, transistor having one current terminal connected to the photodiode, over a plurality of rows and a plurality of columns, a plurality of row selection lines provided for the respective rows and connected to control terminals of the thin-film transistors included in the pixels of the corresponding rows, and a plurality of readout lines provided for the respective columns and connected to the other current terminals of the thin-film transistors included in the pixels of the corresponding columns; a readout circuit section disposed on a second substrate different from the first substrate, and having a plurality of integration circuits for respectively outputting voltage values corresponding to amounts of charges input through the plurality of readout lines; a plurality of panel-side connection points disposed on the first substrate, for respectively interconnecting the plurality of readout lines on the first substrate and the plurality of integration circuits on the second substrate; a plurality of rectifier circuits respectively connected between a plurality of nodes, provided between the plurality of panel-side connection points and the plurality of integration circuits, and a constant potential line; and a plurality of circuit elements respectively connected between the plurality of nodes and the plurality of readout lines, and respectively having resistance components.

The solid-state imaging device may be constructed such that the plurality of rectifier circuits and the constant potential line are disposed on the second substrate. This makes it possible to integrate the rectifier circuit on the same semiconductor substrate as with the integration circuit, for example, thereby cutting down steps of manufacturing the solid-state imaging device.

The solid-state imaging device may be constructed such that the thin-film transistor includes a region constituted by at least one of amorphous silicon and polycrystalline silicon. The off-voltage of the control terminal of such a thin-film transistor is likely to be negative. Even in such a case, the above-described solid-state imaging device can favorably exhibit the above-described effects by setting the potential of the constant potential line to an appropriate positive value.

The solid-state imaging device may be constructed such that the plurality of circuit elements having resistance components are disposed on the second substrate. This makes it possible to integrate the circuit element on the same semiconductor substrate as with the integration circuit, for example, thereby cutting down steps of manufacturing the solid-state imaging device.

The solid-state imaging device may be constructed such that the plurality of circuit elements having resistance components are transistors. This makes it possible to produce the circuit elements easily by using a process similar to a semiconductor process for making semiconductor circuits such as the thin-film transistors on the first substrate and the integration circuits on the second substrate.

The solid-state imaging device may be constructed such that the plurality of circuit elements having resistance components respectively include regions constituted by at least one of amorphous silicon and polycrystalline silicon. The circuit elements can be made easily by using, as its material, amorphous silicon and polycrystalline silicon, which have a resistance value higher than that of monocrystalline semiconductors. When the thin-film transistor on the first substrate includes a region constituted by at least one of amorphous silicon and polycrystalline silicon in particular, such a circuit element can easily be produced on the first substrate.

The solid-state imaging device may be constructed such that the off-voltage of the control terminal of the thin-film transistor is negative. Even in such a case, the above-described solid-state imaging device can favorably exhibit the above-described effects by setting the potential of the constant potential line to an appropriate positive value.

The solid-state imaging device may be constructed such that a plurality of switch circuits are respectively connected between the plurality of nodes and the plurality of integration circuits. This can completely separate the fluctuation of the potential of the readout line caused by a short circuit between the row selection line and readout line from the input potential of the integration circuit. Even when the off-voltage of the control terminal is negative, in the above-described solid-state imaging device, the potential between the above-described node and integration circuit at the time of a short circuit can be kept at a positive potential by the constant potential line, whereby the switch circuit can be operated favorably.

INDUSTRIAL APPLICABILITY

The present invention can be utilized as a solid-state imaging device which, even when a short circuit between a row selection line and a readout line occurs at a certain column, can prevent output voltage values from integration circuits at the other columns from becoming abnormal.

REFERENCE SIGNS LIST 1A, 1B—solid-state imaging device, 10—sensor panel section, 12—glass substrate, 13—panel-side connection point, 14—amorphous silicon film, 16—insulating layer, 18—scintillator, 20—photodetecting section, 21—thin-film transistor, 22—photodiode, 30—vertical shift register section, 40—readout circuit section, 41—substrate, 42—integration circuit, 43—readout-section-side connection point, 44—holding circuit, 51, 52—bonding wire, 61—horizontal shift register section, 71—constant potential line, 72—rectifier circuit, 73—circuit element, 74—switch circuit, 80—base substrate, 81—flexible substrate, $N_1$ to $N_N$—node, $P_{1,1}$ to $P_{M,N}$—pixel, $Q_1$ to $Q_M$—row selection line, $R_1$ to $R_N$—readout line.

The invention claimed is:

1. A solid-state imaging device comprising:
a sensor panel section formed on a first substrate, and having a photodetecting section constructed by two-dimensionally arraying pixels, each including a photodiode and a thin-film transistor having one current terminal connected to the photodiode, over a plurality of rows and a plurality of columns, a plurality of row selection lines provided for the respective rows and connected to control terminals of the thin-film transistors included in the pixels of the corresponding rows, and a plurality of readout lines provided for the respective columns and connected to the other current terminals of the thin-film transistors included in the pixels of the corresponding columns;
a readout circuit section disposed on a second substrate different from the first substrate, and having a plurality of integration circuits for respectively outputting voltage values corresponding to amounts of charges input through the plurality of readout lines;
a plurality of panel-side connection points disposed on the first substrate, and for respectively interconnecting the plurality of readout lines on the first substrate and the plurality of integration circuits on the second substrate;
a plurality of rectifier circuits respectively connected between a plurality of nodes between the plurality of panel-side connection points and the plurality of integration circuits and a constant potential line; and
a plurality of circuit elements respectively connected between the plurality of nodes and the plurality of readout lines, and having resistance components.

2. The solid-state imaging device according to claim 1, wherein the plurality of rectifier circuits and the constant potential line are disposed on the second substrate.

3. The solid-state imaging device according to claim 1, wherein the thin-film transistor includes a region constituted by at least one of amorphous silicon and polycrystalline silicon.

4. The solid-state imaging device according to claim 1, wherein the plurality of circuit elements are disposed on the second substrate.

5. The solid-state imaging device according to claim 1, wherein the plurality of circuit elements are transistors.

6. The solid-state imaging device according to claim 1, wherein the plurality of circuit elements include regions constituted by at least one of amorphous silicon and polycrystalline silicon.

7. The solid-state imaging device according to claim 1, wherein the control terminal of the thin-film transistor has a negative off-voltage.

8. The solid-state imaging device according to claim 1, wherein a plurality of switch circuits are respectively connected between the plurality of nodes and the plurality of integration circuits.

* * * * *